(12) United States Patent
Odaka (10) Patent No.: US 10,409,096 B2
(45) Date of Patent: Sep. 10, 2019

(54) DISPLAY DEVICE

(71) Applicant: Japan Display Inc., Tokyo (JP)

(72) Inventor: Kazuhiro Odaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 44 days.

(21) Appl. No.: 15/844,692

(22) Filed: Dec. 18, 2017

(65) Prior Publication Data

US 2018/0180911 A1 Jun. 28, 2018

(30) Foreign Application Priority Data

Dec. 26, 2016 (JP) ................................ 2016-251180

(51) Int. Cl.
| | | |
|---|---|---|
| *G02F 1/1333* | (2006.01) | |
| *H01L 27/32* | (2006.01) | |
| *H01L 51/00* | (2006.01) | |
| *H01L 51/52* | (2006.01) | |
| *G02F 1/1345* | (2006.01) | |

(52) U.S. Cl.
CPC ........ *G02F 1/1333* (2013.01); *G02F 1/13452* (2013.01); *G02F 1/133305* (2013.01); *H01L 27/3241* (2013.01); *H01L 51/0097* (2013.01); *H01L 51/5246* (2013.01); *H01L 51/5293* (2013.01); *H01L 27/3244* (2013.01); *H01L 2251/5338* (2013.01); *Y02E 10/549* (2013.01)

(58) Field of Classification Search
CPC ...................................................... G02F 1/133
See application file for complete search history.

(56) References Cited

U.S. PATENT DOCUMENTS

| | | | |
|---|---|---|---|
| 2009/0032295 A1* | 2/2009 | Okajima ............. | H05K 1/0203 174/260 |
| 2009/0173795 A1* | 7/2009 | Ochi ................ | G06K 19/07732 235/493 |
| 2013/0112754 A1* | 5/2013 | Ikemoto ............. | G06K 7/10336 235/488 |
| 2016/0181345 A1* | 6/2016 | Lee ..................... | H01L 27/3276 257/40 |
| 2016/0293869 A1* | 10/2016 | Saeki ................... | H05K 999/99 |
| 2016/0306488 A1* | 10/2016 | Kim ...................... | G06F 3/0416 |
| 2017/0148857 A1* | 5/2017 | Goto ................... | H01L 51/5246 |

(Continued)

FOREIGN PATENT DOCUMENTS

| | | | | |
|---|---|---|---|---|
| KR | 10-2015-0112715 | * | 10/2015 | ............. H01L 27/32 |
| KR | 10-2015-0112715 A | | 10/2015 | |
| KR | 1020150112715 | * | 10/2015 | ............. H01L 27/32 |

*Primary Examiner* — Sang V Nguyen
(74) *Attorney, Agent, or Firm* — Michael Best & Friedrich LLP (57) ABSTRACT

A display device includes a bendable substrate having a first side and a second side, a display region above the first side of the substrate, a terminal portion above the first side of the substrate, a first protection film overlapping the display region on the second side of the substrate, a second protection film overlapping the terminal portion on the second side of the substrate, a magnet sheet in contact with the first protection film, and a metal sheet in contact with the second protection film, by bending the substrate in between the display region and the terminal portion, the magnet sheet and the metal sheet face each other, and the magnet sheet and the metal sheet adhere to each other to hold the substrate in a bent state.

13 Claims, 11 Drawing Sheets

(56) References Cited

U.S. PATENT DOCUMENTS

2017/0215288 A1* 7/2017 Shi .................... G09F 9/301
2017/0229666 A1* 8/2017 Tsuruoka ............ H01L 51/0097
2018/0019267 A1* 1/2018 Saeki .................. G02F 1/1303
2018/0070460 A1* 3/2018 Han .................... G06F 1/1652
2018/0284935 A1* 10/2018 Lee .................... G06F 1/1626

* cited by examiner

DISPLAY DEVICE

CROSS-REFERENCE TO RELATED APPLICATIONS

This application is based upon and claims the benefit of priority from the prior Japanese Patent Application No. 2016-251180, filed on Dec. 26, 2016, the entire contents of which are incorporated herein by reference.

FIELD

An embodiment of the present invention relates to a display device using a flexible substrate that may be bent.

BACKGROUND

Liquid crystal display devices using the electro-optic effect of liquid crystals, and organic EL (electro-luminescence) display devices using organic electroluminescence elements and the like have been developed and used practically as display devices used in electric appliances and electronic devices.

A display device has attracted attention in which a display portion, a wiring, and the like are formed on a flexible substrate that may be bent, and in which display is possible even when the display device is bent.

For example, a display device is disclosed in which a flexible substrate may be bent at a non-display portion (frame) (for example, Korean Laid-Open Patent Publication No. 10-2015-0112715). A support member is provided between a bent flexible substrate, and a control layer is fixed to the flexible substrate by an adhesion layer in order to maintain the curvature of the bent portion. In this way, since the frame portion of the display device is narrow, the display device may become smaller.

SUMMARY

A display device according to an embodiment of the present invention includes a bendable substrate having a first side and a second side, a display region above the first side of the substrate, a terminal portion above the first side of the substrate, a first protection film overlapping the display region on the second side of the substrate, a second protection film overlapping the terminal portion on the second side of the substrate, a magnet sheet in contact with the first protection film, and a metal sheet in contact with the second protection film. The magnet sheet and the metal sheet face each other by bending the substrate between the display region and the terminal portion, and the magnet sheet and the metal sheet adhere to each other to hold the substrate in a bent state.

A display device according to another embodiment of the present invention includes a bendable substrate having a first side and a second side, a display region above the first side of the substrate, a terminal portion above the first side of the substrate, a first protection film overlapping the display region on the second side of the substrate, a first metal sheet overlapping the terminal portion on the second side of the substrate, a second metal sheet between the first protection film and the first metal sheet on the second side of the substrate, and a support member having magnetic properties. The first metal sheet and the second metal sheet face each other by bending the substrate between the display region and the terminal portion, the support member is between the first metal sheet and the second metal sheet, and the first metal sheet and the second metal sheet are adhered to the support member to hold the substrate in a bent state.

A display device according to another embodiment of the present invention includes a bendable substrate having a first side and a second side, a display region above the first side of the substrate, a terminal portion above the first side of the substrate, a first protection film overlapping the display region on the second side of the substrate, a first metal sheet overlapping the terminal portion on the second side of the substrate, a second metal sheet in contact with the first protection film, and a support substrate having metallic properties. The first metal sheet and the second metal sheet face each other by bending the substrate between the display region and the terminal portion, the support member is between the first metal sheet and the second metal sheet, and the first metal sheet and the second metal sheet are adhered to the support member to hold the substrate in a bent state.

DESCRIPTION OF EMBODIMENTS

Hereinafter, each embodiment of the present invention will be described while referencing the drawings. However, without deviating from the gist of the present invention, the embodiments may be implemented in various ways, and interpretation is not limited to the content exemplified below. In order to provide a clearer description, some components of the drawings such as the width, thickness, and shape of each part are represented schematically. These schematic drawings are merely examples and do not limit interpretation of the present invention. In this specification and in each of the drawings, elements similar to previously described elements are marked with the same symbols, and redundant descriptions are omitted accordingly.

In an embodiment of the present invention, when one film is manufactured and a plurality of films are formed, these plurality of films have different functions and roles. However, these plurality of films are derived from film formed as the same film in the same process, and have the same layer structure and the same materials. Accordingly, these plurality of films are defined as being in the same layer.

Further, in this specification, expressions such as "above" and "below" used when describing the drawings express the relative location relationship between the structure of focus and other structures. In this specification, the direction facing the later described bank from the insulating surface is defined as being "above," and the opposite direction is described as being "below." In the scope of the present specification and the claims, when simply "above" is written to express a state in which a structural component is arranged above another structural component, so long as there are no limitations, it includes both cases in which a structural component is arranged directly above so as to be in contact with another structural component, and in which a structural component is arranged above another structural component via further another structural component.

Further, ordinal numbers such as "first", "second", and "third" in this specification are used only to simplify explanations, and should not limit interpretation.

Figure 1:
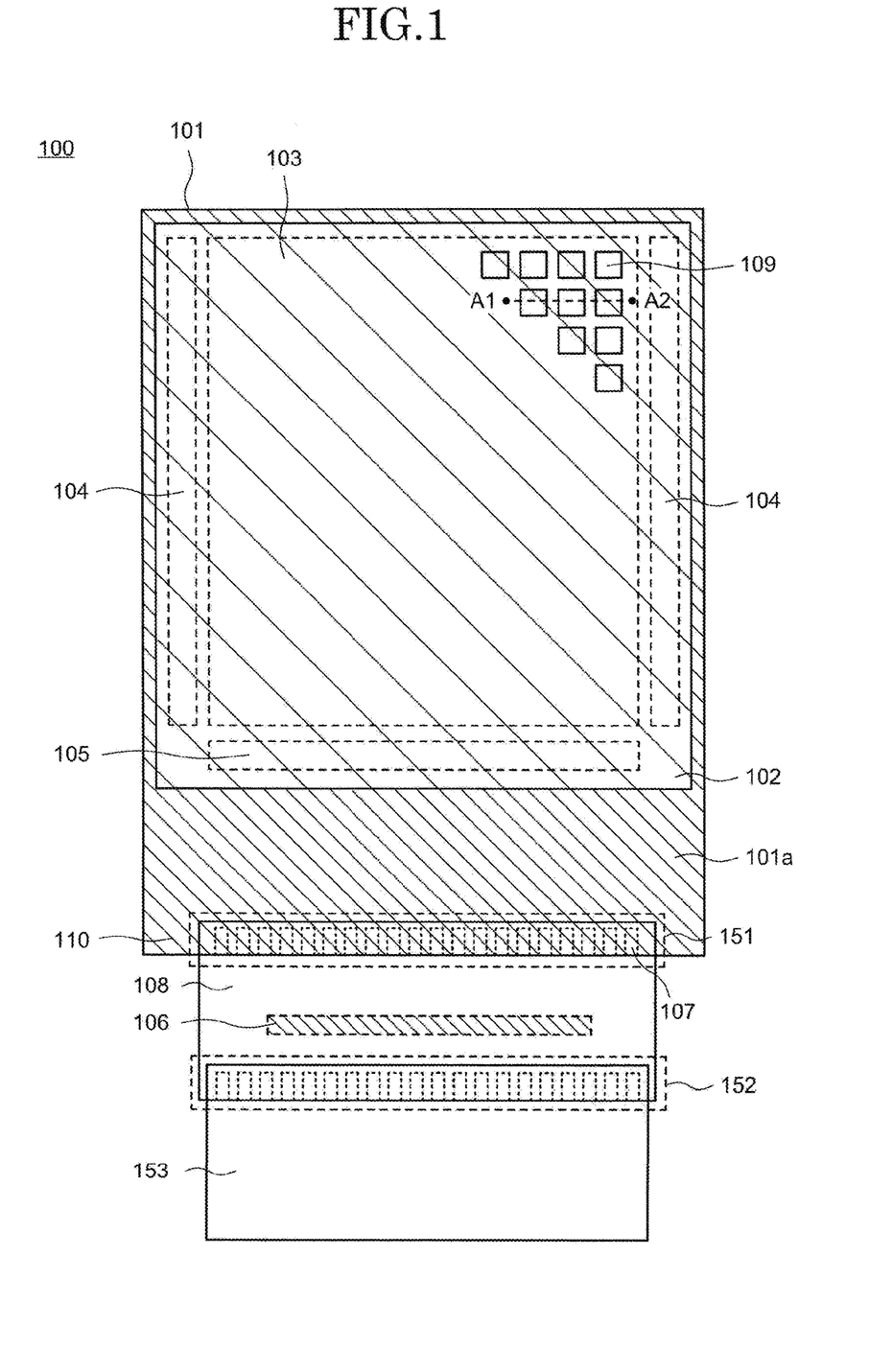
FIG. 1 is a schematic view of a display device in a plan view according to an embodiment of the present invention.

FIG. 1 is a schematic diagram showing the structure of a display device 100 before it is bent according to an embodiment of the present invention, and shows the display device 100 in a plan view. In this specification, a state in which the display device 100 is seen from a direction perpendicular to the screen (display region) is referred to as a "plan view."

As shown in FIG. 1, the display device 100 includes a display region 103, a scanning line drive circuit 104, a data line drive circuit 105, and a driver IC 106 formed above the insulating surface. The driver IC 106 functions as a control unit supplying signals to the scanning line drive circuit 104 and the data line drive circuit 105. The data line drive circuit 105 may be built into the driver IC 106. The driver IC 106 is externally attached above the flexible print substrate 108 on which the driver IC 106 is mounted by COP (Chip on Plastic), however, it may also be arranged above the substrate 101. In FIG. 1, the driver IC 106 is on the back side of the flexible print substrate 108. The flexible print substrate 108 is connected to the terminals 107 in the peripheral region 110. The flexible print substrate 108 is connected to an FPC (Flexible Printed Circuit) 153 via a terminal portion 152.

Here, the insulating surface is a first side 101a of the substrate 101. The substrate 101 supports each layer forming transistors and light emitting elements above that surface. In the present embodiment, a bendable substrate is used as the substrate 101. Organic resin materials such as polyimide, acrylic, epoxy, and polyethylene terephthalate may be used as the substrate 101.

In the display region 103 shown in FIG. 1, a plurality of pixels 109 are arranged in a matrix. Each pixel 109 includes a light emitting element formed of a pixel electrode (anode), an organic layer (light emitting element) including a light emitting layer stacked above the pixel electrode, and a counter electrode (cathode). A data signal is supplied to each pixel 109 in response to image data from the data line drive circuit 105. In the display device, a transistor electrically connected to the pixel electrode in each pixel 109 may be driven according to these data signals, and screen display may be performed in response to image data. Typically, a thin film transistor (TFT) may be used as a transistor. However, the element performing image display is not limited to a thin film transistor, and may be any kind of element as long as it is an element equipped with a current control function.

Figure 2:
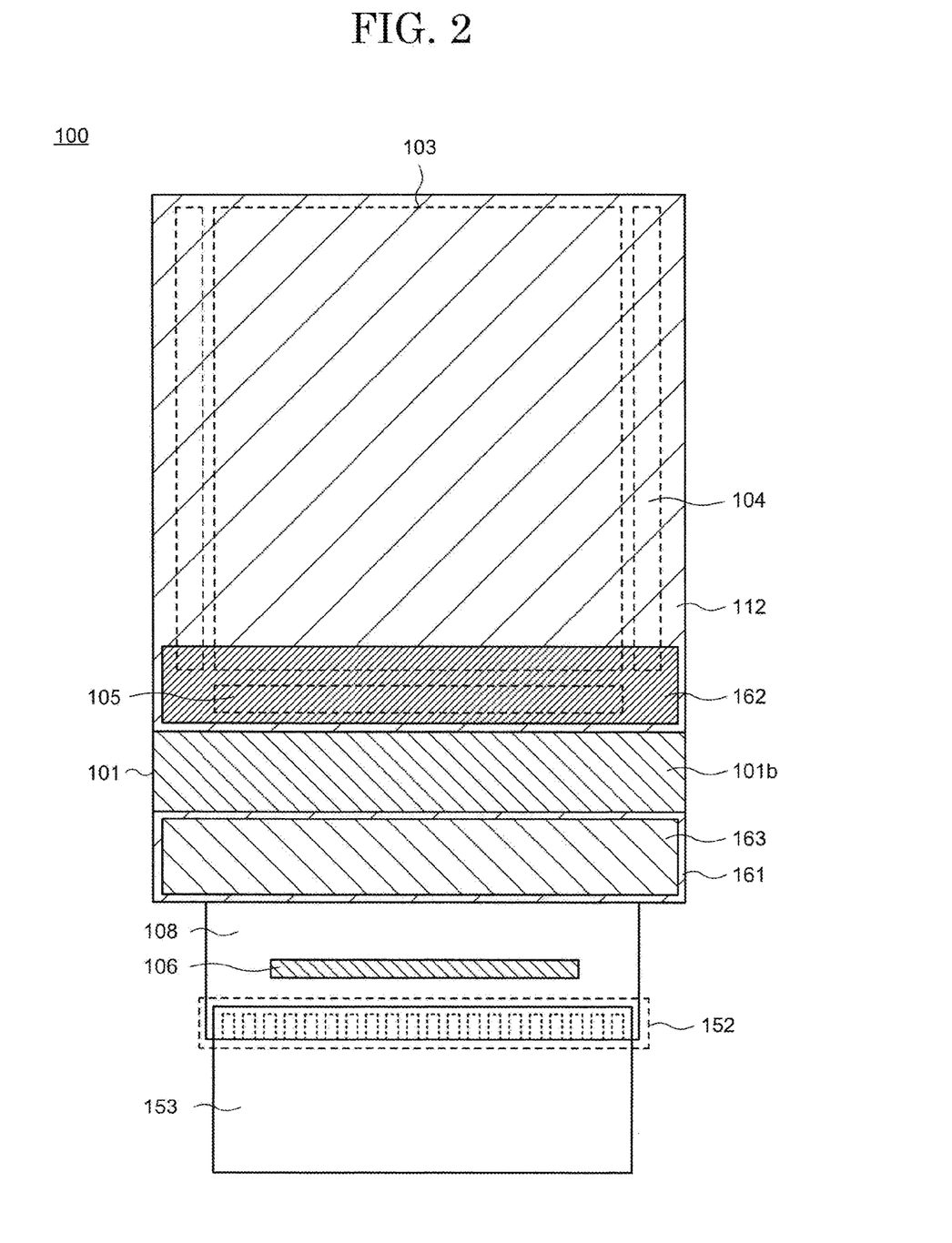
FIG. 2 is a schematic view of a display device in a plan view according to an embodiment of the present invention.

Next, in FIG. 2 is a schematic diagram of the back side of the display device 100 before bending in a plan view. A protection film 112 and a protection film 161 are on the second side 101b (back side) of the substrate 101. The protection film 112 and the protection film 161 are provided separately. The protection film 112 overlaps the display region 103, and the protection film 161 overlaps the terminal portion 151. Further, the protection film 112 may cover the scanning line drive circuit 104 and the data line drive circuit 105.

In the present specification, the display region side of the display device is described as the first side 101a, and the other side of the display surface is described as the second side 101b. However, the other side of the display surface may be the first side 101a and the display surface may be the second side 101b.

The thickness of the bendable substrate 101, for example, may be 10 μm to 30 μm. Since the film of the substrate 101 is thin, maintaining the shape of the substrate 101 is difficult. By providing the protection film 112 and the protection film 161, the shape of the substrate 101 may be held constant. By providing the protection film 122 and the protection film 161, moisture and oxygen may be prevented from permeating the light emitting element on the substrate 101.

In the schematic diagram of the back side of the display device 100 in a plan view of FIG. 2, a magnet sheet 162 is provided above the protection film 112. The magnet sheet 162 is a synthetic rubber sheet containing a magnetic powder. The protection film 112 and the magnet sheet 162 are adhered by an adhesive material. A metal sheet 163 is above the protection film 161. Metals having ferromagnetic properties (for example, iron, cobalt, nickel, and alloys thereof) may be used as the metal sheet 163. The protection film 161 and the metal sheet 163 are adhered by an adhesive material.

Figure 3:
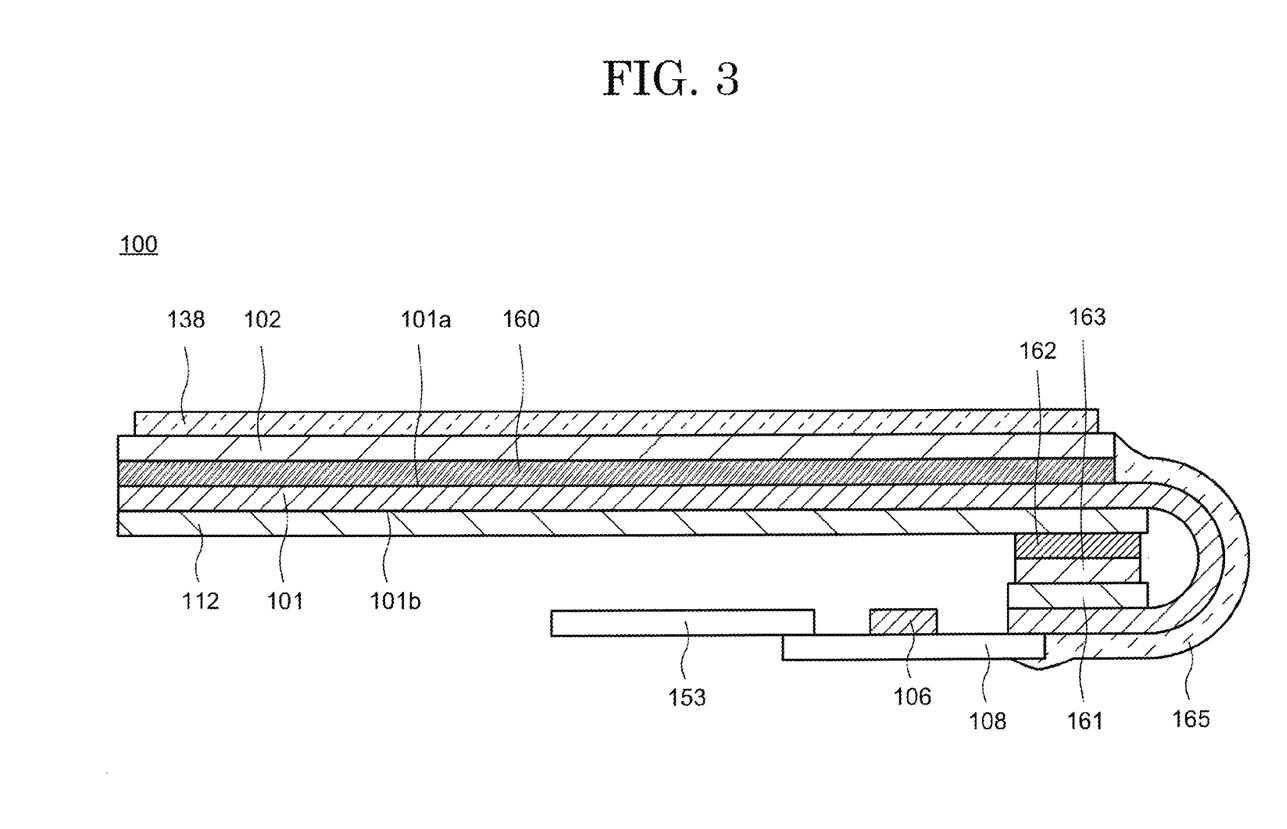
FIG. 3 is a cross-sectional view showing a display device according to an embodiment of the present invention.

Next, a cross-sectional view of the display device 100 shown in FIG. 1 and FIG. 2 in a state in which the substrate 101 is bent between the display region 103 and the terminal portion 151 is shown in FIG. 3.

As shown in FIG. 3, a protection film 102 and a polarization plate 138 are above an element formation layer 160. The protection film 102 is provided so as to cover the display region 103 above the first side 101a of the substrate 101. The display region 103 is formed in the element formation layer 160.

A support substrate is provided on the back side of the bent flexible substrate in order to maintain the strength of the flexible substrate. However, in order to bend the flexible substrate, the support substrate is not provided in the bending region. Thus, the strength of the substrate weakens in the bending region of the flexible substrate.

When the flexible substrate is bent and the flexible substrate and the support member are held in place by an adhesion layer, if the flexible substrate and the support member are adhered at a misaligned position, it becomes difficult for the flexible substrate to return to a state before it was bent. Cracks may form in the weak regions of the flexible substrate when the flexible substrate and the support member are peeled off in order to correct the adhered position. In a case such as this, if the flexible substrate cannot return to the state before it was bent, the yield rate may decrease. When cracks form in the flexible substrate, the reliability of the display device may decrease.

In the display device according to one embodiment the present invention, as shown in FIG. 3, the magnet sheet 162 and the metal sheet 163 face each other by bending the substrate 101 between the display region 103 and the terminal portion 151. The metal sheet 163 is adhered by the magnetic force of the magnet sheet 162, thus the magnet sheet 162 and the metal sheet 163 may be held in place.

The substrate 101 may be held in a bent state by the structure shown in FIG. 3. The magnet sheet 162 and the metal sheet 163 may separate without applying force to the substrate 101, even if the adhered position thereof is misaligned. For this reason, cracks may be prevented from forming in the weak regions in which the protection film 112 and the protection film 161 are not provided. Thus, the display device 100 may be highly reliable. In addition, the yield rate in the manufacturing process may be improved.

The radius of curvature when the substrate 101 is bent may be determined by the distance between the display region 103 and the terminal portion 151, and the film thickness of each of the protection film 112, the protection film 161, the magnet sheet 162, and the metal sheet 163. The curvature radius of the substrate 101 when it is bent may vary by the thickness of the protection film 112, the protection film 161, the magnet sheet 162, and the metal sheet 163. The curvature of the substrate 101 when it is bent may, for example, be 50 μm to 5000 μm.

In FIG. 2 and FIG. 3, an example is shown in which the magnet sheet 162 is adhered to the protection film 112, and the metal sheet 163 is adhered above the protection film 161. However, one embodiment of the present invention is not limited to this. The magnet sheet 162 may be adhered to the protection film 161, and the metal sheet 163 may be adhered to the protection film 112. In addition, a magnet sheet may be provided in both the protection film 112 and the protection film 161.

Figure 4:
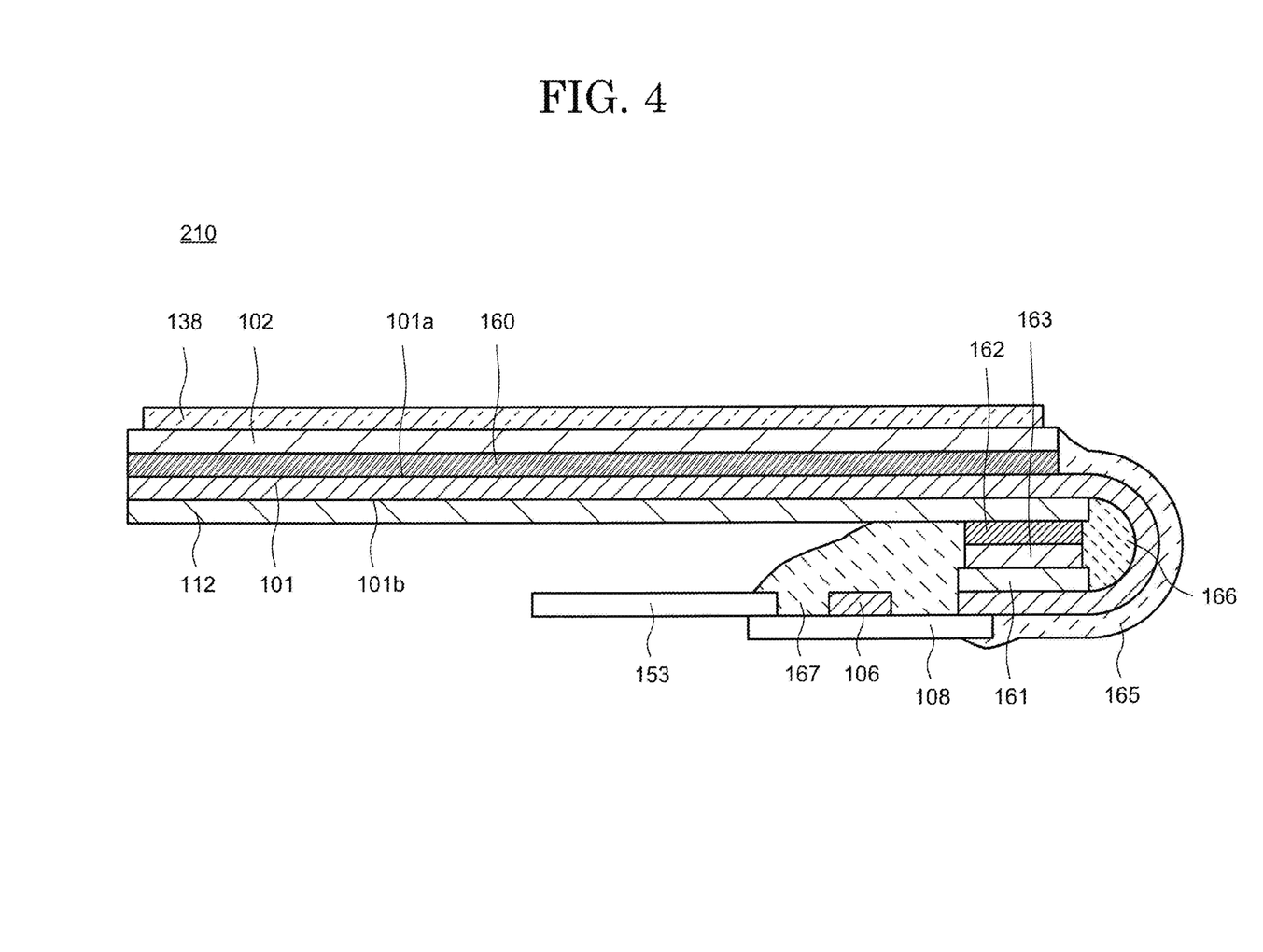
FIG. 4 is a cross-sectional view showing a display device according to an embodiment of the present invention.

Next, a display device 210 is shown in FIG. 4 having a structure in which a portion thereof differs from that of the display device 100 shown in FIG. 3. In the display device 210 shown in FIG. 4, an organic resin 166 is provided in the gaps formed by the substrate 101, the protection film 112, the protection film 161, the magnet sheet 162, and the metal sheet 163. The organic resin 166 is provided in order to hold the substrate 101 in a bent state. By providing the organic resin 166, even if an external force is applied to the bent region of the substrate 101, stress may be prevented from acting on the substrate 101. Accordingly, since cracks may be prevented from forming in the bent region of the substrate 101, the reliability of the display device 200 may be improved.

An organic resin 167 may be provided above the flexible print substrate 108 so as to be in contact with the substrate 101, the protection film 161, the metal sheet 163, the magnet sheet 162, and the protection film 112. By providing the organic resin 167, the region in which the magnet sheet 162 and the metal sheet 163 are in contact may be held in place.

In FIG. 4, an example is shown in which the organic resin 166 and the organic resin 167 are provided. However, in one embodiment of the present invention is not limited to this. Either one of the organic resin 166 or the organic resin 167 may be provided.

In the display device shown in FIG. 3 and FIG. 4, a structure is shown in which the magnet sheet 162 is provided in the protection film 112 and the metal sheet 163 is provided in the protection film 161. However, in one embodiment of the present invention is not limited to this. In the display device shown in FIG. 3 and FIG. 4, the metal sheet 163 may be provided in the protection film 112, and the magnet sheet 162 may be provided in the protection film 161.

Figure 5:
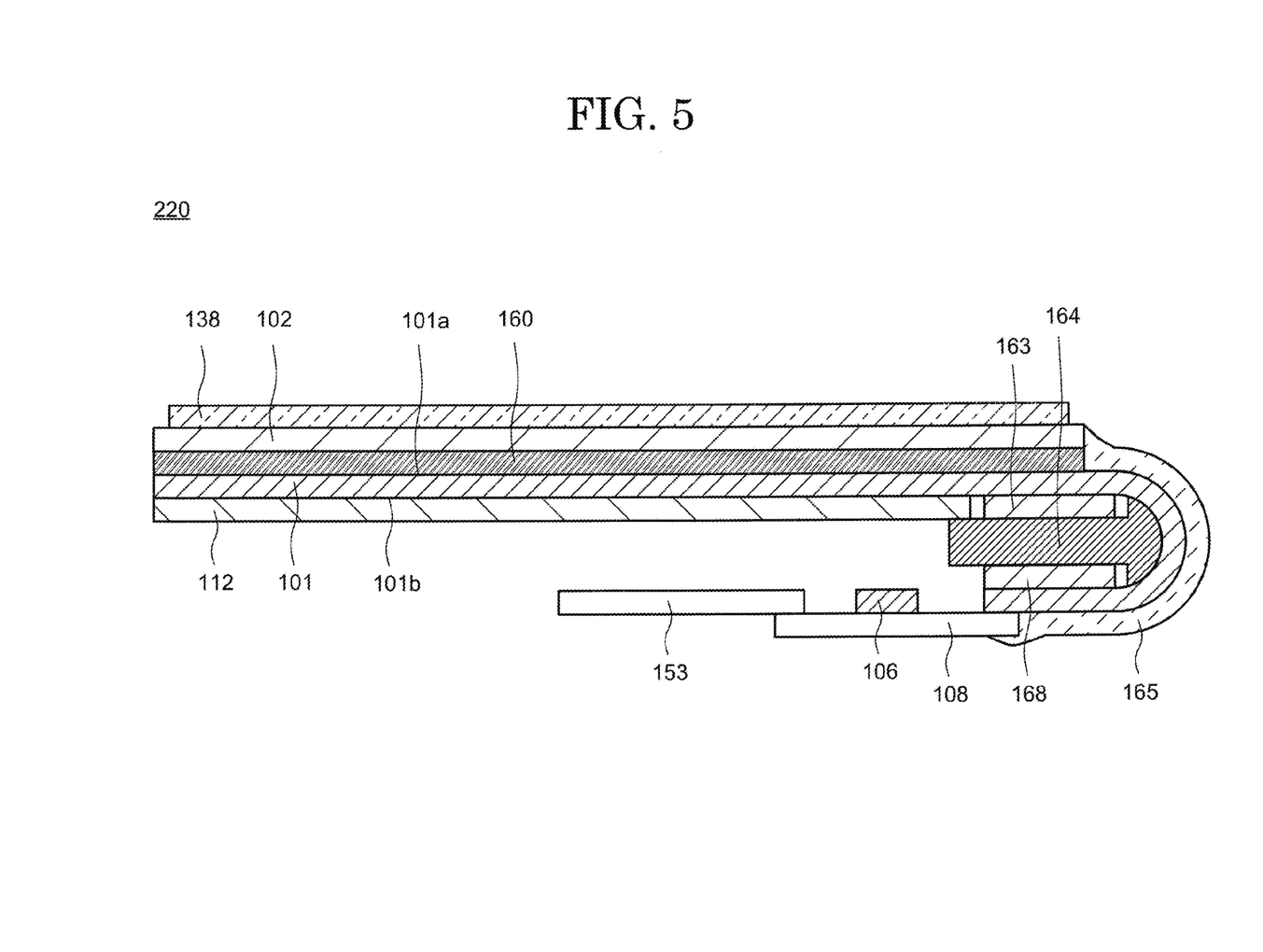
FIG. 5 is a cross-sectional view showing a display device according to an embodiment of the present invention.

Next, a display device 220 is shown in FIG. 5 having a structure in which a portion thereof differs from the display device 100 shown in FIG. 3. In FIG. 5, the metal sheet 163 overlaps a portion of the display region 103 on the second side 101b of the substrate 101, and a metal sheet 168 overlaps the terminal portion. Metals having ferromagnetic properties (for example, iron, cobalt, nickel, and alloys thereof) may be used as the metal sheet 163 and the metal sheet 168.

In the region between the display region 103 and the terminal portion 151, the substrate 101 is bent and a support member 164 is interposed between the metal sheet 163 and the metal sheet 168. The support member 164 may use a synthetic rubber containing magnetic powder and a magnet. The support member 164 has a curved surface on a portion of the side surface. The curved surface of the support member 164 is arranged so as to be in contact with the bent region of the substrate 101, and holds the bent substrate 101 in place. In this way, the bent region of the substrate 101 may have a fixed curvature ratio.

The curvature ratio of the substrate 101 when it is bent may be determined by the distance between the display region 103 and the terminal portion 151, and the curvature ratio of the curved surface of the support member 164. The curvature ratio of the substrate 101 when it is bent may vary by the thickness of the metal sheet 163, the support member 164, and the metal sheet 168. The curvature ratio of the substrate 101 when it is bent may be, for example, 50 μm to 5000 μm.

In FIG. 5, a structure is shown in which the support member 164 is a material having metallic properties, and the metal sheet 163 and the metal sheet 168 are adhered to the support member 164. However, in one embodiment of the present invention is not limited to this. The support member 164 may have a structure in which a magnet sheet is provided as a metal having ferromagnetic properties overlapping the display region 103 of the second side 101b of the substrate 101 and overlapping the terminal portion 151 of the second side 101b of the substrate 101.

Figure 6:
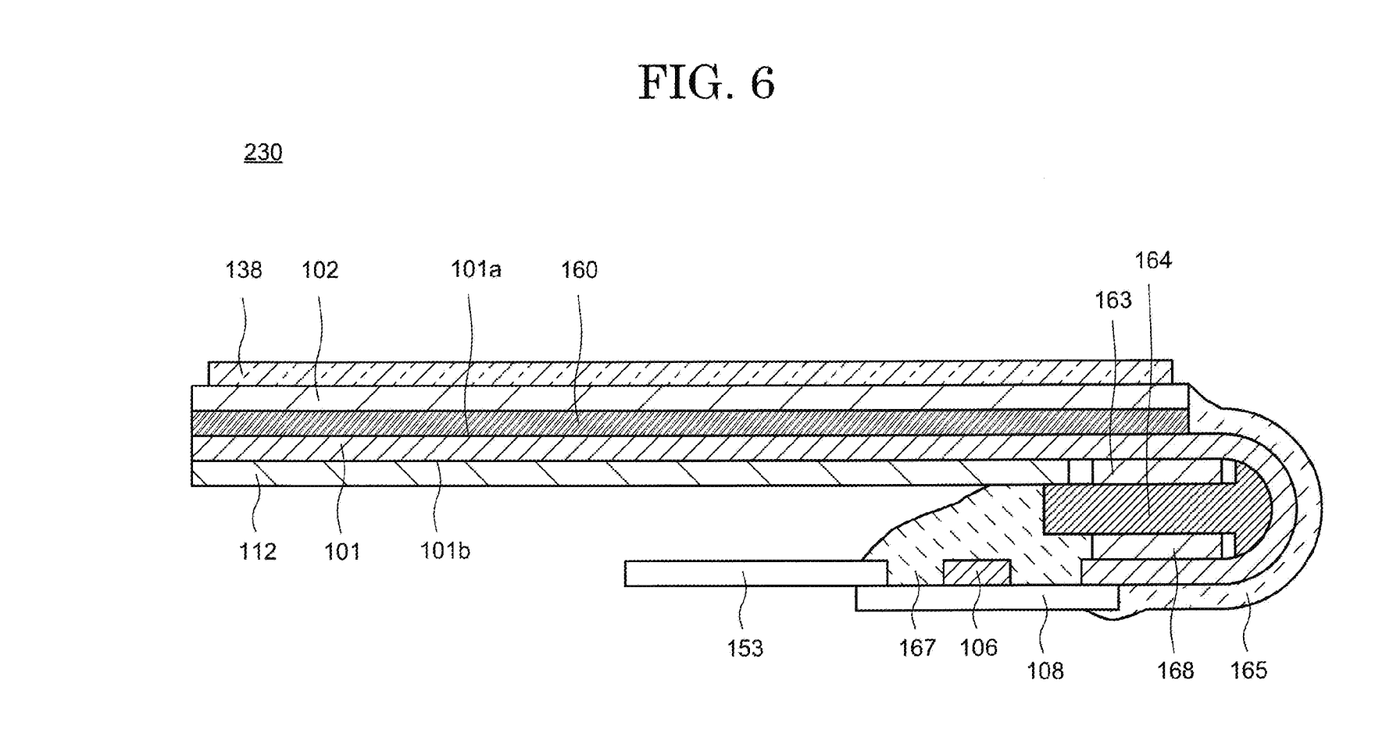
FIG. 6 is a cross-sectional view showing a display device according to an embodiment of the present invention.

As in the display device 230 shown in FIG. 6, the organic resin 167 may be provided so as to be in contact with the substrate 101, the protection film 161, the metal sheet 163, the metal sheet 168, and the protection film 112 above the flexible print substrate 108. By providing the organic resin 167, the region in which the metal sheet 163 and the metal sheet 168 are in contact with the support member 164 may be held in place.

Figure 7:
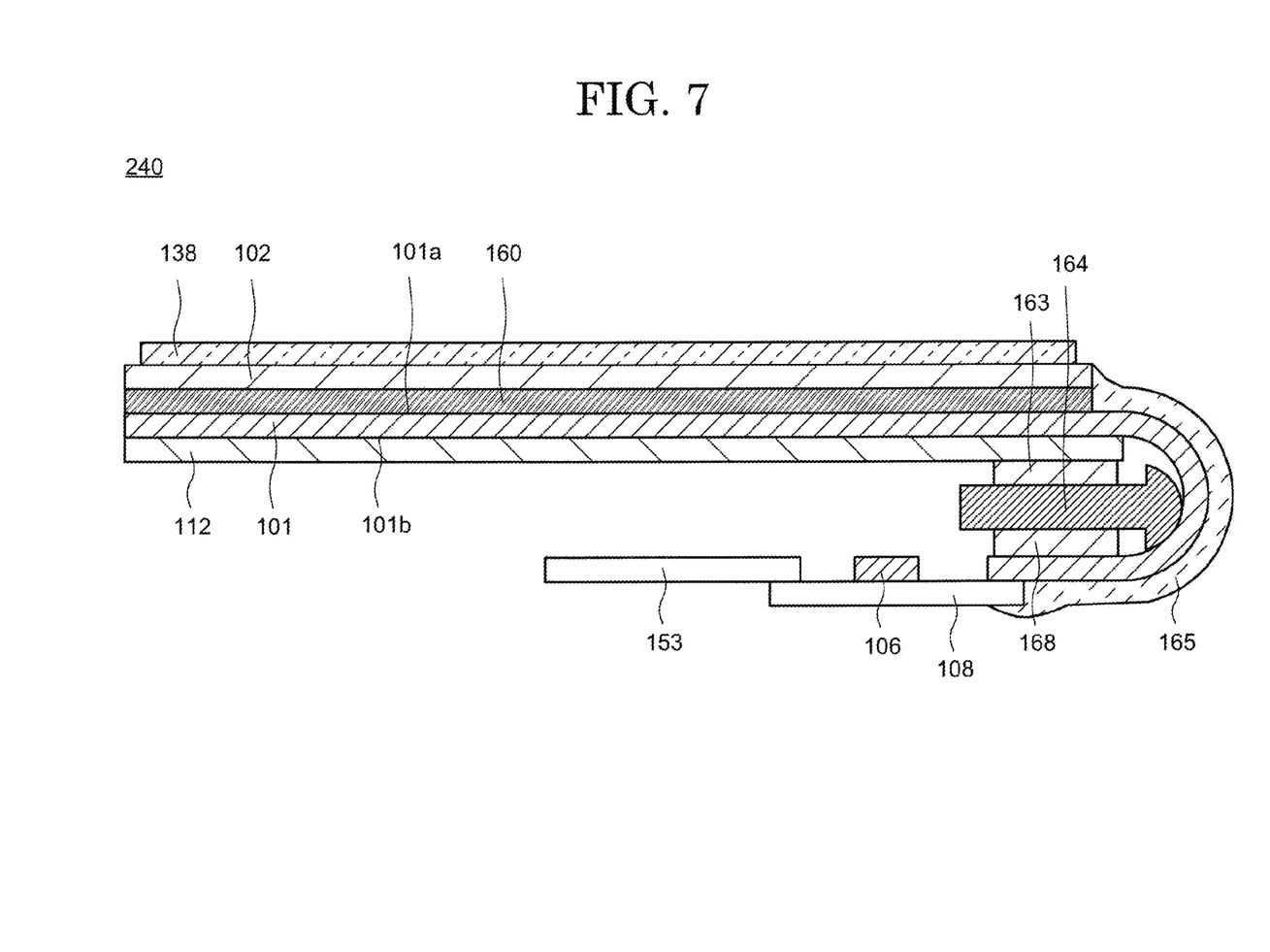
FIG. 7 is a cross-sectional view showing a display device according to an embodiment of the present invention.

Next, a display device 240 is shown in FIG. 7 having a structure in which a portion thereof differs from that of the display device 100 shown in FIG. 5. On the second side 101b of the substrate 101, the metal sheet 163 overlaps a portion of the display device and the metal sheet 168 overlaps the terminal portion. Metals having ferromagnetic properties (for example, iron, cobalt, nickel, and alloys thereof) may be used as the metal sheet 163 and the metal sheet 168. In the region between the display region 103 and the terminal portion 151, the support member 164 is interposed between the metal sheet 163 and the metal sheet 168, and the substrate 101 is bent. In the case shown in FIG. 7, the support member 164 may be a synthetic rubber containing magnetic powder and a magnet. The support member 164 has a curved surface in the region in contact with the substrate 101. The substrate 101 is bent along the curved surface of the support member 164.

As shown in FIG. 7, the metal sheet 163 and the metal sheet 168 face each other by bending the substrate 101 between the display region 103 and the terminal portion 151. The support member 164 having magnetic properties is between the metal sheet 163 and the metal sheet 168. Synthetic rubber containing magnetic powder and magnets may be used as the support member having magnetic properties. The substrate 101 bends along the curved surface of the support member 164. The metal sheet 163 and the metal sheet 168 are adhered by the magnetic force of the support member 164 having magnetic properties, thus the support member 164, the metal sheet 163, and the metal sheet 168 may be held in place.

In FIG. 7, a structure is shown in which the support member 164 is a material having ferromagnetic properties, and the metal sheet 163 and the metal sheet 168 are adhered to the support member 164. However, in one embodiment of the present invention is not limited to this. The support member 164 may be a metal material, and a magnet sheet may be above the second side 101b of the substrate 101.

The curvature ratio of the substrate 101 when it is bent may be determined by the distance between the display region 103 and the terminal portion 151, and the curvature ratio of the curved surface of the support member 164. The curvature ratio of the substrate 101 when it is bent may vary by the thickness of the metal sheet 163, the support member 164, the protection film 112, and the metal sheet 168. The curvature ratio of the substrate 101 when it is bent, for example, may be 50 µm to 5000 µm.

Although not illustrated, an organic resin 167 may be provided above the flexible print substrate 108 so as to come in contact with the substrate 101, the metal sheet 163, the metal sheet 168, the support member 164, and the protection film 112. By providing the organic resin 167, the region in which the magnet sheet 162 and the metal sheet 163 are in contact may be held in place.

Structure of Pixel

Figure 8:
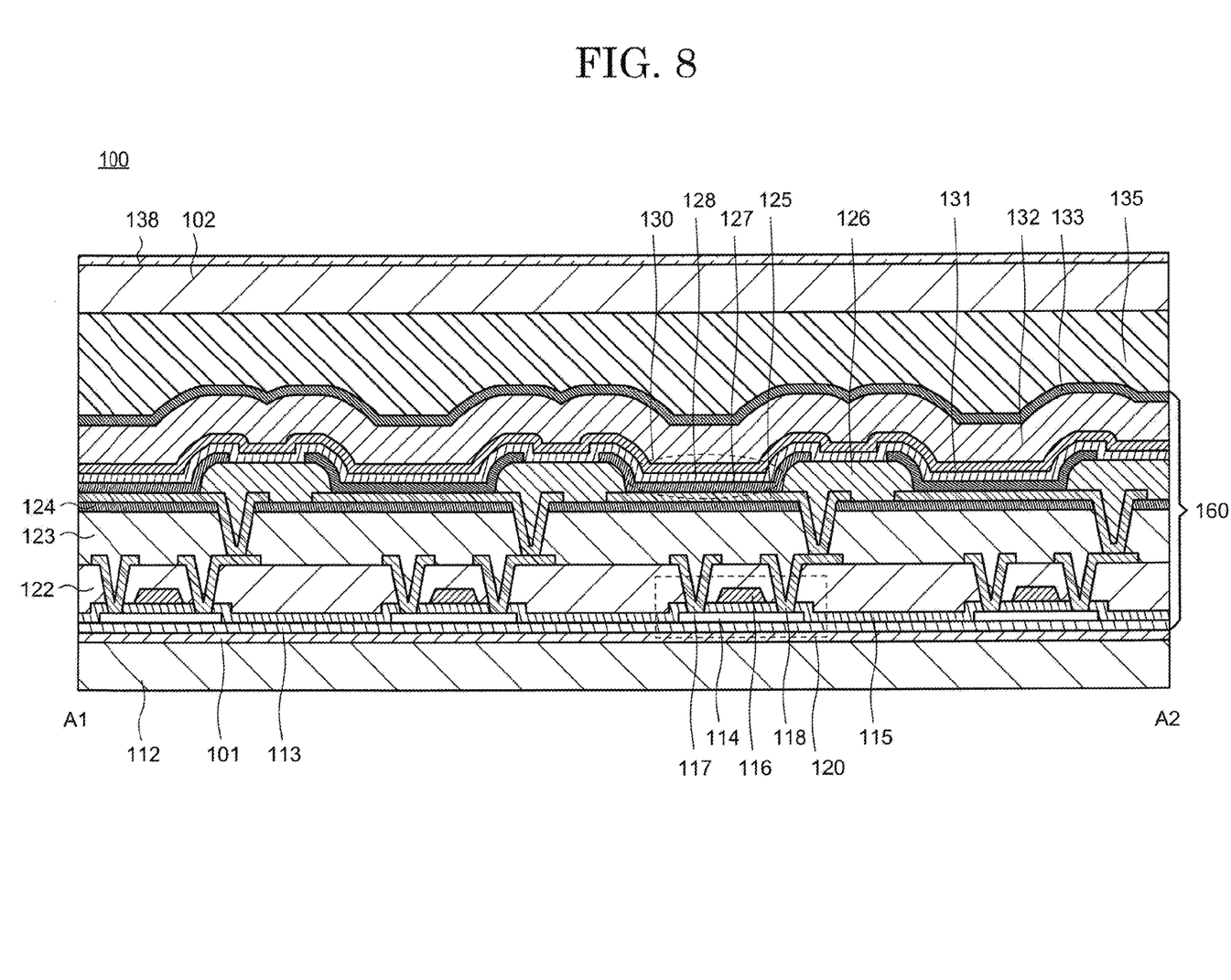
FIG. 8 is a cross-sectional view showing a display device according to an embodiment of the present invention.

FIG. 8 is a diagram showing an example of the structure of the pixels in the display device 100 of embodiment 1. Specifically, it is a diagram showing the structure of a cross-section taken at line A1-A2 of the display region 103 shown in FIG. 1. In FIG. 8, a cross-section of three light emitting elements 130 is shown as a portion of the display region 103. Further, three light emitting elements 130 are illustrated in FIG. 8. However, more than several million light emitting elements are actually arranged in a matrix pattern corresponding to the pixels in the display region 103.

As shown in FIG. 8, the display device 100 has a substrate 101, a protection film 112, and a protection film 102. A glass substrate, a quartz substrate, a flexible substrate (polyimide, polyethylene terephthalate, polyethylene naphthalate, triacetylcellulose, cyclic olefin copolymers, cycloolefin polymers, and other resin substrates having flexibility) may be used as the substrate 101, the protection film 112, and the protection film 102. When it is not necessary for the substrate 101, the protection film 112, and the protection film 102 to have light transmissivity, a metal substrate, a ceramic substrate, or a semiconductor substrate may be used. In one embodiment of the present invention, a case in which a polyimide is used as the substrate 101, and polyethylene terephthalate is used as the protection film 112 and the protection film 102 is described.

A base film 113 is provided above the substrate 101. The base film 113 is an insulating layer formed of inorganic materials such as silicon oxide, silicon nitride, and aluminum oxide. The base film 113 is not limited to a single layer, and for example may have a stacked structure combining a silicon oxide layer and a silicon nitride layer. This structure may be appropriately determined considering the adhesiveness of the substrate 101 and the gas barrier properties against the later described transistor 120.

The transistor 120 is above the base film 113. The structure of the transistor 120 may be a top gate or bottom gate type. In the present embodiment, the transistor 120 includes a semiconductor layer 114 above the base film 113, a gate insulating film 115 covering the semiconductor layer 114, and a gate electrode 116 above the gate insulating film 115. An interlayer insulating layer 122 covering the gate electrode 116 is above the transistor 120, and a source electrode or drain electrode 117, source electrode or drain electrode 118 each connected to the semiconductor layer 114 are above the interlayer insulating layer 122. In the present embodiment, an example in which the interlayer insulating layer 122 has a single layer structure is described. However, the interlayer insulating layer 122 may have a stacked structure.

Further, the materials of each layer forming the transistor 120 may be known materials and are not particularly limited. For example, polysilicon, amorphous silicon, or an oxide semiconductor may be generally used as the semiconductor layer 114. Silicon oxide or silicon nitride may be used as the gate insulating film 115. The gate electrode 116 is formed of metal materials such as copper, molybdenum, tantalum, tungsten, and aluminum. Silicon oxide or silicon nitride may be used as the interlayer insulating layer 122. The source electrode or drain electrode 117 and the source electrode or drain electrode 118 are each formed of metal materials such as copper, titanium, molybdenum, and aluminum.

Although not illustrated in FIG. 8, a first wiring may be in the same layer as the gate electrode 116 and formed of the same metal materials as the metal materials forming the gate electrode 116. The first wiring, for example, may be provided as a scanning line or the like driven by the scanning line drive circuit 104. Additionally, although not illustrated in FIG. 8, a second wiring may extend in a direction intersecting the first wiring in the same layer as the source electrode or drain electrode 117 and the source electrode or drain electrode 118. The second wiring, for example, may be provided as a data line or the like driven by the data line drive circuit 105.

A planarization film 123 is above the transistor 120. The planarization film 123 is formed including organic resin materials. Known organic resin materials such as polyimide, polyamide, acrylic, and epoxy may be used as the organic resin materials. The films of these materials may be formed by a solution coating method and have a highly flattening effect. Although not particularly illustrated, the planarization film 123 is not limited to a single layer structure, and may have a stacked layer structure of a layer including organic resin materials and an inorganic insulating layer.

The planarization film 123 has a contact hole exposing a portion of the source electrode or drain electrode 118. The contact hole is an opening for electrically connecting the later described pixel electrode 125 and the source electrode or drain electrode 118. However, the contact hole overlaps a portion of the source electrode or drain electrode 118. The source electrode or drain electrode 118 is exposed at the bottom of the contact hole.

A protection film 124 is above the planarization film 123. The protection film 124 overlaps the contact hole formed in the planarization film 123. The protection film 124 preferably has a barrier function against moisture and oxygen, and for example is formed using inorganic insulating materials such as silicon nitride film and aluminum oxide.

The pixel electrode 125 is above the protection film 124. The pixel electrode 125 overlaps the contact hole of the planarization film 123 and the protection film 124, and is electrically connected to the source electrode or drain electrode 118 exposed at the bottom of the contact hole. In the display device 100 of the present embodiment, the pixel electrode 125 functions as an anode in the light emitting element 130. The structure of the pixel electrode 125 differs depending on whether or not it is a top emission type or bottom emission type. For example, in the case of a top emission type, a metal film with a high refraction rate, or a stacked structure of a transparent conductive layer with a high work function such as an indium oxide type transparent conductive layer (for example ITO) and a zinc oxide type transparent conductive layer (for example IZO, ZnO) and a metal layer is used as the pixel electrode 125. Conversely, in the case of a bottom emission type, a transparent conductive film described above is used as the pixel electrode 125. In the present embodiment, a top emission type organic EL display device will be described as an example. The edge portion of the pixel electrode 125 is covered by the later described first insulating layer 126.

A first insulating layer 126 formed of organic resin material is above the pixel electrode 125. Known organic resin material such as polyimide, polyamide, acrylic, epoxy, or siloxane may be used as the organic resin material. The first insulating layer 126 has an opening above a portion of the pixel electrode 125. The first insulating layer 126 is between adjacent pixel electrodes 125 so as to cover the edge portion of the pixel electrodes 125, and functions as a member separating adjacent pixel electrodes 125. For this reason, the first insulating layer 126 is generally called a "partition", "rib", or "bank." A portion of the pixel electrodes 125 exposed from the first insulating layer 126 becomes the light emitting region of the light emitting element 130. The inner wall of the opening of the first insulating layer 126 preferably has a taper shape. Thus, when the light emitting layer to be described layer is formed, coverage defects in the edge portion of the pixel electrodes 125 may be reduced. The first insulating layer 126 not only covers the edge portion of the pixel electrodes 125, it may also function as a filler embedding uneven portions caused by contact holes in the planarization film 123 and the protection film 124.

An organic layer 127 is above the pixel electrode 125. The organic layer 127 has a light emitting layer formed of at least organic materials, and functions as the light emitting portion of the light emitting element 130. In the organic layer 127, other than the light emitting layer, a variety of charge transport layers such as an electrode injection layer, an electron transport layer, a hole injection layer, and a hole transport layer may also be included. The organic layer 127 is provided so as to cover the light emitting region, that is to say, so as to cover the opening of the first insulating layer 126 and the opening of the first insulating layer 126 in the light emitting region.

Further, in the present embodiment, a light emitting layer is provided in the organic layer 127 emitting light of a desired color, and the organic layer 127 is formed having a different light emitting layer above each pixel electrode 125, thus each color of RGB is displayed. That is to say, in the present embodiment, the light emitting layer of the organic layer 127 is not continuous between adjacent pixel electrodes 125. Each type of charge transport layer is continuous between adjacent pixel electrodes 125. Known structures and known materials may be used in the organic layer 127, which is not especially limited to the structures of the present embodiment. The organic layer 127 may have a light emitting layer emitting white light, and each color of RGB may be displayed through a color filter. In this case, the organic layer 127 may be above the first insulating layer 126.

A counter electrode 128 is above the organic layer 127 and above the first insulating layer 126. The counter electrode 128 functions as a cathode forming the light emitting element 130. Since the display device 100 of the present embodiment is a top emission type, a transparent electrode is used as the counter electrode 128. An MgAg thin film or a transparent conductive film (ITO and IZO) are used as the thin film forming the transparent electrode. The counter electrode 128 spans between each pixel above the first insulating layer 126. The counter electrode 128 is electrically connected to an external terminal via the lower conductive layer in the peripheral region near the edge portion of the display region 103. As described above, in the present embodiment, the light emitting element 130 is formed by a portion of the pixel electrodes 125 (anode) exposed from the first insulating layer 126, the organic layer 127 (light emitting portion), and the counter electrode 128 (cathode).

As shown in FIG. 8, a first inorganic insulating layer 131, an organic insulating layer 132, and a second inorganic insulating layer 133 are above the display region 103. The first inorganic insulating layer 131, the organic insulating layer 132, and the second inorganic insulating layer 133 function as a sealing film for preventing moisture and oxygen from permeating the light emitting element 130. By providing the sealing film above the display region 103, moisture and oxygen are prevented from permeating the light emitting element 130, and the reliability of the display device may be improved. Film such as silicon nitride (SixNy), silicon oxynitride (SiOxNy), silicon nitride oxide (SiNxOy), aluminum oxide (AlxOy), aluminum nitride (AlxNy), aluminum oxynitride (AlxOyNz), and aluminum nitride oxide (AlxNyOz), for example, may be used as the first inorganic insulating layer 131 and the second inorganic insulating layer 133 (x, y, and z are arbitrary). In addition, polyimide resin, acrylic resin, epoxy resin, silicone resin, fluorine resin, siloxane resin, and the like may be used as the organic insulating layer 132. Further, the organic insulating layer 132 and the second inorganic insulating layer 133 have a shape tracing the shape of the surface of the first inorganic insulating layer 131. However, the upper surface of the organic insulating layer 132 becomes flat, and the thickness of the organic insulating layer 132 of the region in which the first insulating layer 126 is not provided is thicker than the thickness of the organic insulating layer 132 above the first insulating layer 126. Thus the upper surface of the second inorganic insulating layer 133 may also become flat.

Everything from the base film 113 to the sealing film described above is referred to as an element formation layer 160 in the present embodiment.

An adhesive material 135 is above the second inorganic insulating layer 133. The adhesive material 135, for example, may use adhesive materials such as acrylic, rubber, silicone, and urethane. Moisture absorbing substances such as calcium and zeolite may be included in the adhesive material 135. By including moisture absorbing substances in the adhesive material 135, even when moisture permeates the inside of the display device 100, moisture may be delayed from entering the light emitting element 130. A spacer may be provided in the adhesive material 135 so as to separate the spaces between the substrate 101 and the protection film 102. A spacer such as this may be mixed in the adhesive material 135, and may also be formed by resin and the like above the substrate 101.

An overcoat layer may be provided for planarization, for example, in the protection film 102. In the case of the organic layer 127 emits a white light, color filters corresponding to each color of RGB, or a black matrix provided between the color filters may be provided on the main surface (the surface facing the substrate 101) of the protection film 102. In the case of color filters are not formed on the protection film 102 side, for example, a color filter may be formed directly above the sealing film, and an adhesive material 135 may be formed above this sealing film. The polarization plate 138 is provided on the back side (display surface side) of the protection film 102.

Manufacturing Method

Next, the manufacturing method of the display device 100 will be described while referencing FIG. 9 to FIG. 13.

Figure 9:
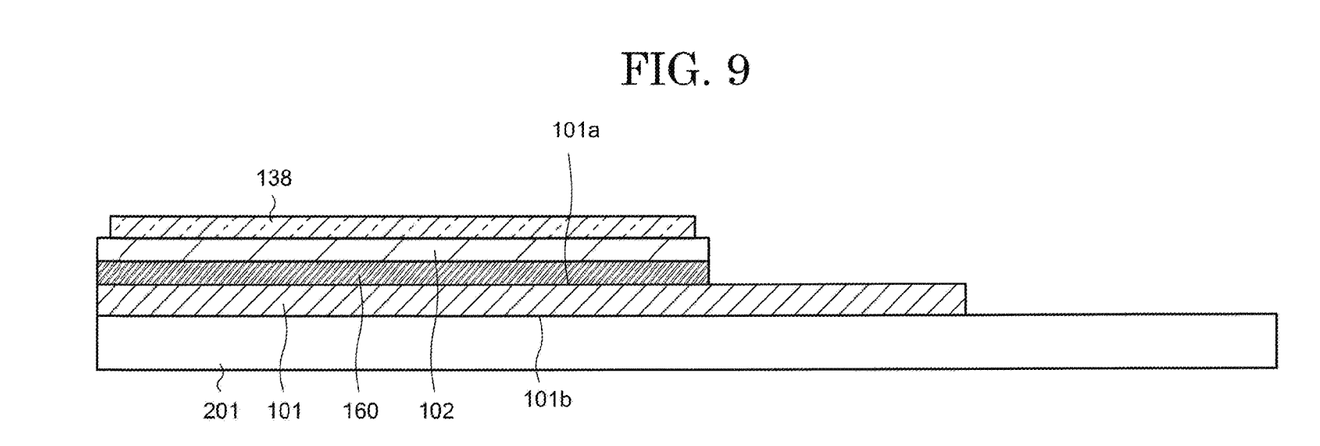
FIG. 9 is a cross-sectional view showing the manufacturing method of a display device according to an embodiment of the present invention.

First, as shown in FIG. 9, the element formation layer 160 is formed above the substrate 101 formed on a support substrate 201. In the present embodiment, for example, polyimide may be used as the substrate 101. The film thickness of the substrate 101 is 10 μm or more to 30 μm or less. The element formation layer 160, as shown in FIG. 8, is formed from the base film 113 to the sealing film. The transistor of the display region 103, the light emitting element electrically connected to the transistor, the transistor of the scanning line drive circuit 104, and the like are included in the element formation layer 160.

Next, the protection film 102 is adhered above the element formation layer 160 via adhesive materials (not illustrated). PET (polyethylene terephthalate), for example, may be used as the protection film 112.

Then, a polarizing plate 138 is adhered above the protection film 102 via adhesive materials (not illustrated). A circular polarization plate is preferably used as the polarization plate 138.

Figure 10:
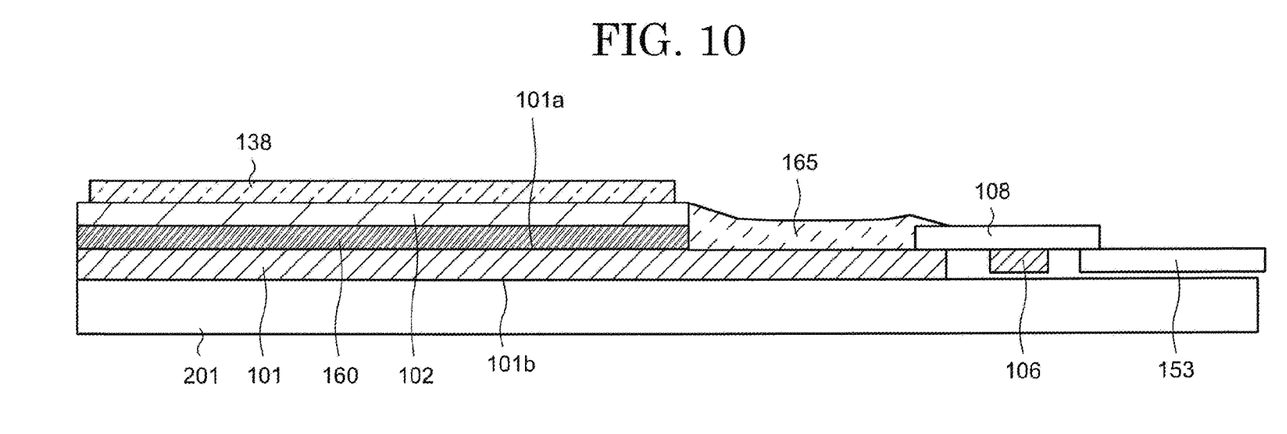
FIG. 10 is a cross-sectional view showing the manufacturing method of a display device according to an embodiment of the present invention.

Next, as shown in FIG. 10, a flexible print substrate 108 is adhered to the terminal portion 151 of the substrate 101 via an anisotropic conductive film (not illustrated). The organic resin 165 is formed after the flexible print substrate 108 is adhered to the terminal portion 151 of the substrate 101 so as to be in contact with the flexible print substrate 108, the element formation layer 160, and the protection film 102.

Figure 11:
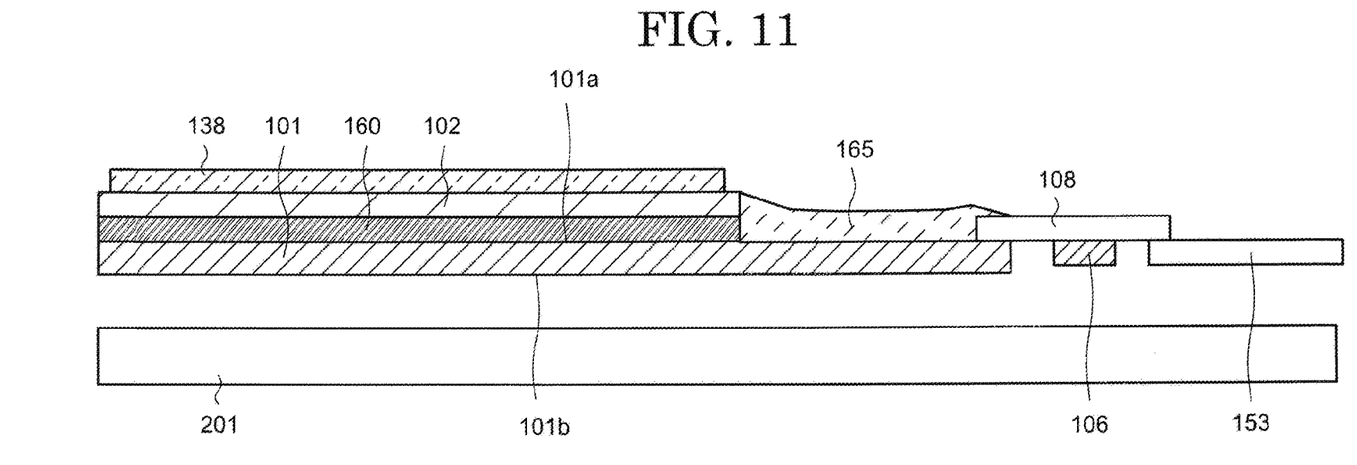
FIG. 11 is a cross-sectional view showing the manufacturing method of a display device according to an embodiment of the present invention.

Next, as shown in FIG. 11, by radiating lasers to the substrate 101 via the support substrate 201, the substrate 101 is separated from the support substrate 201.

Figure 12:
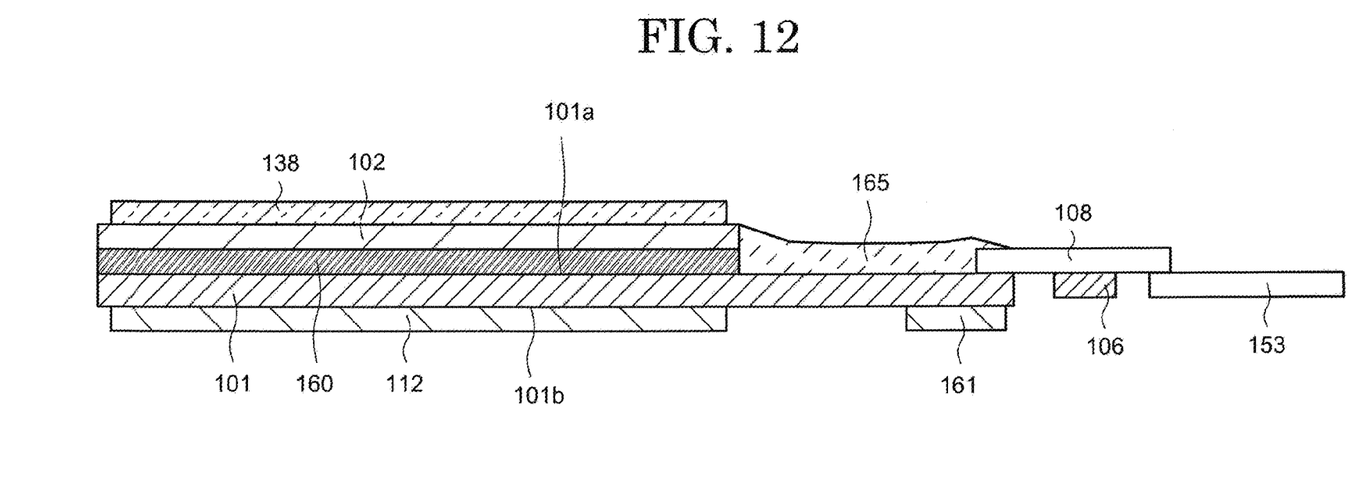
FIG. 12 is a cross-sectional view showing the manufacturing method of a display device according to an embodiment of the present invention.

Next, as shown in FIG. 12, the protection film 112 and the protection film 161 are adhered to the second side 101b of the substrate 101. The protection film 112 overlaps the display region 103 formed in the element formation layer 160 of the substrate 101, and the protection film 161 overlaps the terminal portion 151 formed on the substrate 101.

Figure 13:
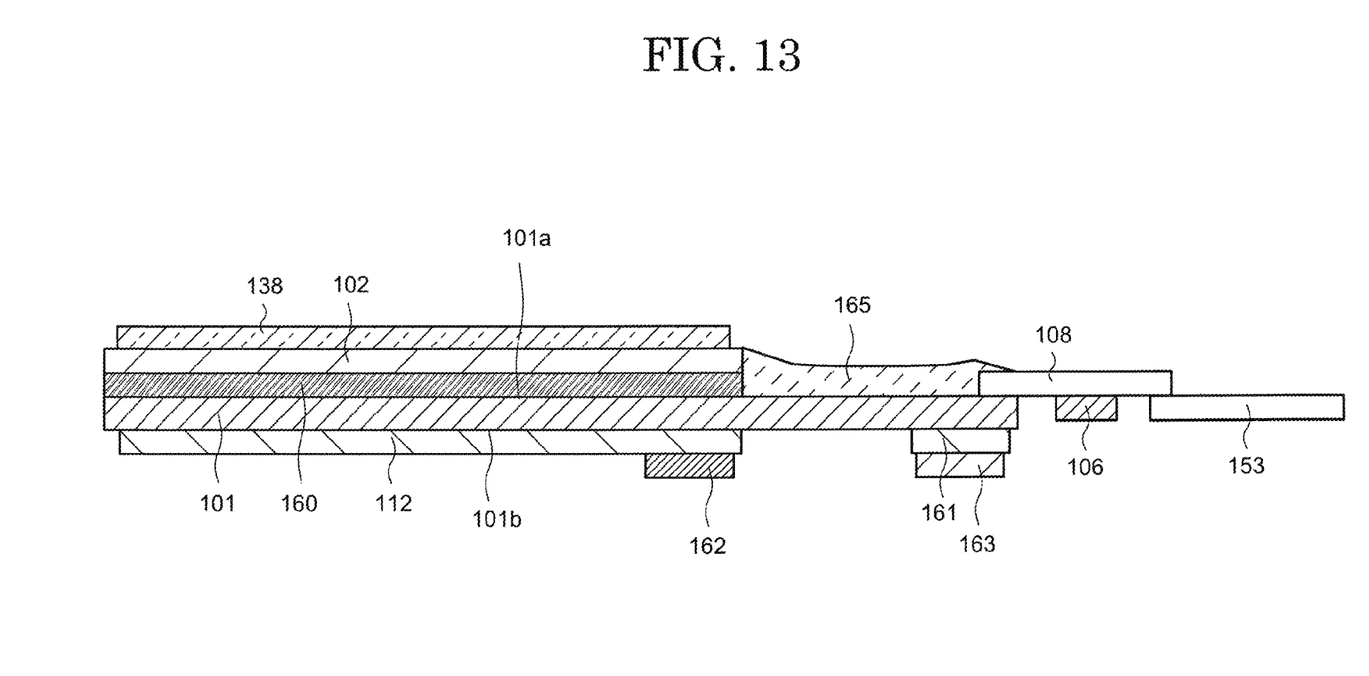
FIG. 13 is a cross-sectional view showing the manufacturing method of a display device according to an embodiment of the present invention.

Next, as shown in FIG. 13, the magnet sheet 162 is adhered to the protection film 112 via an adhesive material, and the metal sheet 163 is adhered to the protection film 161 via an adhesive material.

Next, the magnet sheet 162 and the metal sheet 163 face each other by bending the substrate 101 between the display region 103 and the terminal portion 151. A state in which the substrate 101 is bent may be maintained by adhering the magnet sheet 162 and the metal sheet 163.

The display device 100 shown in FIG. 3 may be manufactured by the above steps.

In the manufacturing process of the display device, when the flexible substrate is bent and the flexible substrate and the support member are held in place by an adhesion layer, if the flexible substrate and the support member are adhered at a misaligned position, it becomes difficult for the flexible substrate to return to a state before it was bent. When the flexible substrate and the support member are separated in order to fix the adhered position, cracks may form in the weak regions of the flexible substrate. In a case such as this, if the flexible substrate cannot return to a state before it was bent, the yield rate may decrease. When cracks form in the flexible substrate, the reliability of the display device may decrease.

In the manufacturing method of the display device according to one embodiment of the present invention, when a protection film is not provided and the substrate 101 is bent between the display region 103 and the terminal portion 151, even if the adhered position is misaligned, the substrate may easily return to the state it was in before it was bent. Thus, the yield rate may be improved. In addition, cracks may be prevented from forming in the weak regions. In this way, the reliability of the display device may be improved.

After the magnet sheet 162 and the metal sheet 163 are adhered, the organic resin 166 is formed in the gaps between the substrate 101, the protection film 112, the protection film 161, the magnet sheet 162, and the metal sheet 163. Further, the organic resin 167 may be formed above the flexible print substrate 108 so as to be in contact with the substrate 101, the protection film 161, the metal sheet 163, the magnet sheet 162, and the protection film 112.

Based on the display device described as the embodiments of the present invention, any appropriate addition, removal or alteration of elements, or addition, omission, or alteration of steps made by a person skilled in the art are included within the scope of the present invention, so long as they support the gist of the present invention. Each embodiment described above, so long as they are not technologically inconsistent, may be combined.

Even if the function effects are different from the function effects from the implementation of each of the embodiments described above, it is understood that anything made clear from the contents of the present specification, or anything easily predicted by a person skilled in the art, naturally comes from the present invention.

What is claimed is:

1. A display device comprising:
   a bendable substrate having a first side and a second side;
   a display region above the first side of the substrate;
   a terminal portion above the first side of the substrate;
   a first protection film overlapping the display region on the second side of the substrate;
   a second protection film overlapping the terminal portion on the second side of the substrate;
   a magnet sheet in contact with the first protection film;
   a metal sheet in contact with the second protection film;
   a flexible print substrate electrically connected to the terminal portion; and
   a first organic resin,
   wherein between the display region and the terminal portion, by bending the substrate, the magnet sheet and the metal sheet face each other,
   the magnet sheet and the metal sheet adhere to each other to hold the substrate in a bent state, and
   the first organic resin is in contact with the flexible print substrate, the metal sheet, the magnet sheet, the first protection film, and the second protection film.

2. The display device according to claim 1, further comprising
   a third protection film covering the display region above the first side of the substrate.
3. The display device according to claim 1, wherein
   the metal sheet includes iron, cobalt, nickel, or an alloy thereof.
4. The display device according to claim 1, wherein
   the magnet sheet is a synthetic rubber sheet containing a magnetic powder.
5. The display device according to claim 1, further comprising
   a second organic resin in contact with the second side of the substrate, the first protection film, the second protection film, the magnet sheet, and the metal sheet.
6. A display device comprising:
   a bendable substrate having a first side and a second side;
   a display region above the first side of the substrate;
   a terminal portion above the first side of the substrate;
   a first protection film overlapping the display region on the second side of the substrate;
   a first metal sheet overlapping the terminal portion on the second side of the substrate;
   a second metal sheet provided on the second side of the substrate between the first protection film and the first metal sheet;
   a support member having magnetic properties; and
   a flexible print substrate electrically connected to the terminal portion, and a first organic resin,
   wherein
   the first metal sheet and the second metal sheet face each other by bending the substrate between the display region and the terminal portion,
   the support member is provided between the first metal sheet and the second metal sheet, the first metal sheet and the second metal sheet are adhered to the support member to
   hold the substrate in a bent state, and
   the first organic resin is in contact with the flexible print substrate, the first metal sheet, the second metal sheet, and the first protection film.
7. The display device according to claim 6, further comprising
   a second protection film covering the display region above the first side of the substrate.
8. The display device according to claim 6, wherein
   the first metal sheet and the second metal sheet include iron, cobalt, nickel, or an alloy thereof.
9. The display device according to claim 6, wherein
   the support member is a synthetic rubber containing a magnetic powder.
10. A display device comprising:
   a bendable substrate having a first side and a second side;
   a display region above the first side of the substrate;
   a terminal portion above the first side of the substrate;
   a first protection film provided in a first region overlapping the display region on the second side of the substrate;
   a first metal sheet provided in a second region overlapping the terminal portion on the second side of the substrate;
   a second metal sheet provided in contact with the first protection film;
   a support member having magnetic properties; and
   a flexible print substrate electrically connected to the terminal portion, and a first organic resin,
   wherein
   the first metal sheet and the second metal sheet face each other by bending the substrate between the display region and the terminal portion,
   the support member is provided between the first metal sheet and the second metal sheet,
   the first metal sheet and the second metal sheet are adhered to the support member to hold the substrate in a bent state, and
   the first organic resin is in contact with the flexible print substrate, the first metal sheet, the second metal sheet, and the first protection film.
11. The display device according to claim 10, further comprising
   a second protection film covering the display region above the first side of the substrate.
12. The display device according to claim 10, wherein
   the first metal sheet and the second metal sheet include copper, cobalt, nickel, or an alloy thereof.
13. The display device according to claim 10, wherein
   the support member is a synthetic rubber containing a magnetic powder.

* * * * *